Figure 1:
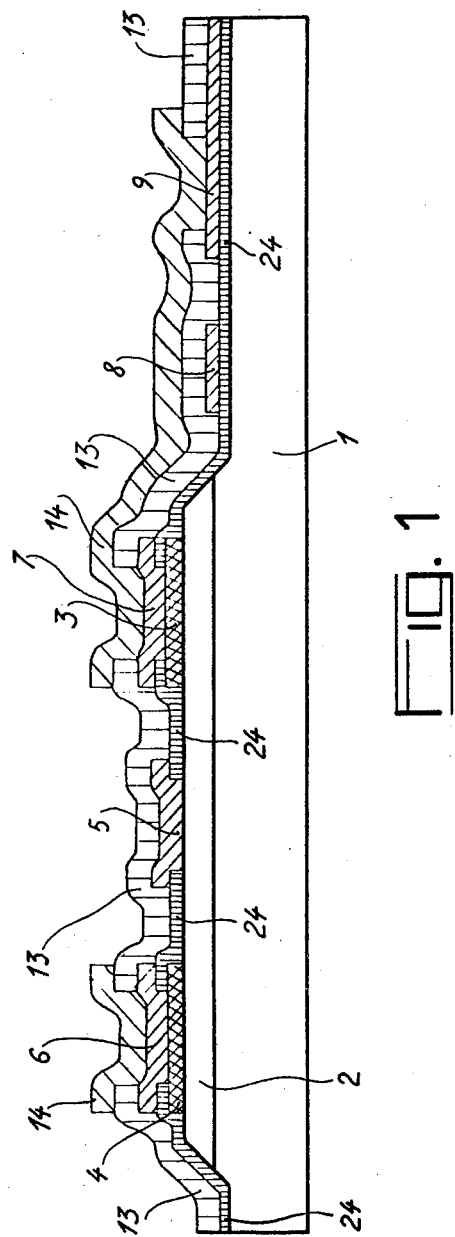

United States Patent [19]

Nuzillat et al.

[11] 4,263,340

[45] Apr. 21, 1981

[54] PROCESS FOR PRODUCING AN INTEGRATED CIRCUIT

[75] Inventors: Gérard Nuzillat; Christian Arnodo, both of Paris, France

[73] Assignee: Thomson-CSF, Paris, France

[21] Appl. No.: 17,955

[22] Filed: Mar. 6, 1979

[30] Foreign Application Priority Data

Mar. 8, 1978 [FR] France ............................... 78 06673

[51] Int. Cl.³ .......................................... H01L 29/48
[52] U.S. Cl. ..................................... 427/84; 427/89; 427/93; 427/94; 427/99; 357/15
[58] Field of Search ................ 427/84, 96, 99; 357/15

[56] References Cited

U.S. PATENT DOCUMENTS

| 4,016,643 | 4/1977 | Pucel et al. ............................ 357/15 |
| 4,173,063 | 11/1979 | Kniepkamp et al. .................. 357/15 |

OTHER PUBLICATIONS

Van Tuyl et al., IEEE Journal of Solid State Circuits, vol. sc-12 #5 10/77, pp. 485-496.
IEEE Spectrum, vol. 14 #3, pp. 41-47 & FIG. 2, 1977.

*Primary Examiner*—Ralph S. Kendall
*Attorney, Agent, or Firm*—Cushman, Darby & Cushman

[57] ABSTRACT

An integrated circuit and process for producing an integrated circuit. The circuit includes two interconnection layers, a lower layer being separated from the substrate by a thin dielectric layer, and separated from the upper layer by a thick dielectric layer, the interconnections between the two interconnection layers being situated outside the zone of the active elements of the integrated circuit. The circuit comprises active elements deposited for example on portions of an n-type layer supported by a substrate of semi-insulating gallium arsenide. Ohmic and Schottky contacts are connected either to the lower interconnection layer or to the upper interconnection layer. The thin dielectric layer is for example a silica layer whose thickness is less than 1,000 Angstroms, the thick dielectric layer having a thickness of 5,000 to 10,000 Angstroms.

3 Claims, 12 Drawing Figures

PROCESS FOR PRODUCING AN INTEGRATED CIRCUIT

The invention relates to an integrated circuit on a semi-conductor substrate and the process for producing this circuit.

It is known that for the last few years such semi-conductors are employed which are constituted by compounds of the groups III–V of the Mendeleev classification and in particular gallium arsenide Ga As.

The main difficulties encountered in the production of such circuits are the creation of ohmic or Schottky contacts of very small size and low ohmic resistance. Another difficulty encountered is the fact that a layer of conductors in direct contact with the semi-insulating Ga As is liable to give rise to a junction and to be the cause of troublesome interface phenomena such as stray capacitance and currents.

This invention provides an integrated circuit which does not have these drawbacks.

According to the invention, there is provided an integrated circuit of the type comprising elements integrated on a monocrystalline semi-insulating substrate formed by a compound of elements of the groups III and V of the Mendeleev classification, the active elements of the circuit employing in the active zone a doped n-type layer deposited on the substrate, said integrated circuit comprising an interconnection system having two layers, the lower being in electric contact with the ohmic or Schottky contacts in the zone of active element are insulated from the substrate outside the active zone by a first layer of thin dielectric; the upper layer being separated from the lower layer by a second thicker dielectric layer being connected to the lower layer by way of apertures in the second dielectric layer in the region of the ohmic contacts in the active zone and at crossing points of the two layers located in particular outside the zone of active elements.

Figure 2:
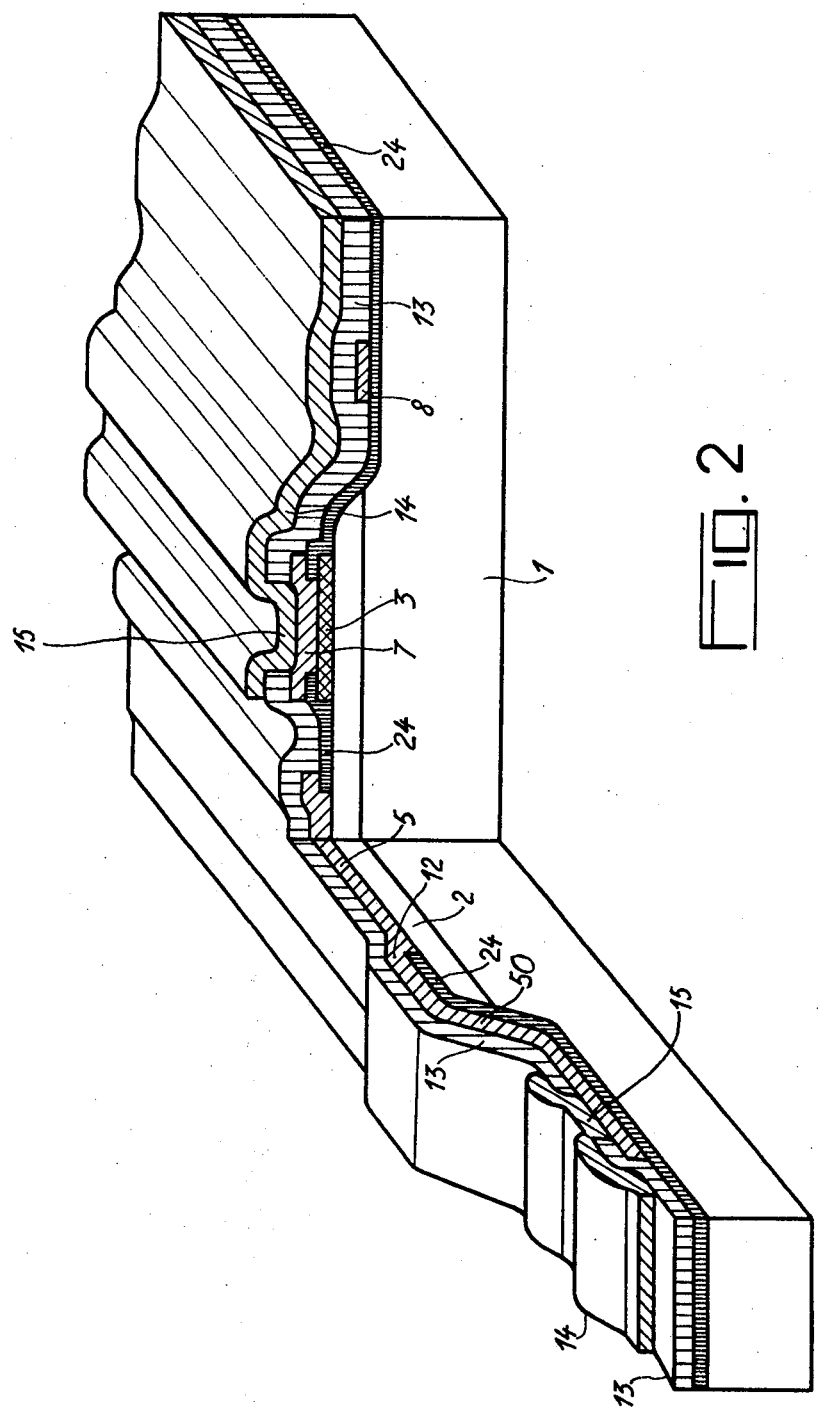
Figure 3:
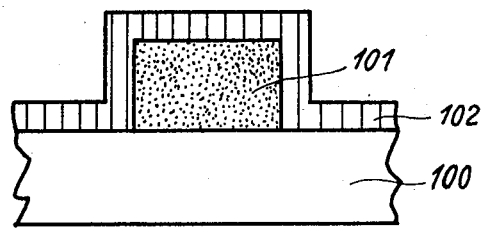
Figure 4:
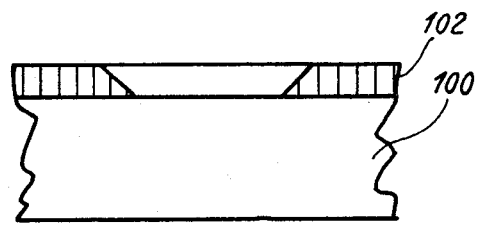
Figure 5:
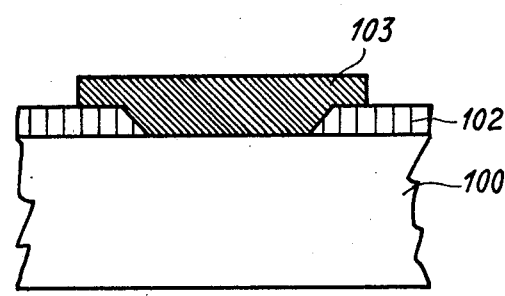

A better understanding of the invention will be had from the ensuing description with reference to the accompanying drawings in which:

FIGS. 1 and 2 show respectively one embodiment of the invention in longitudinal section and in perspective with a part cut away respectively;

FIGS. 3, 4 and 5 explain the process termed "lift-off";

FIGS. 6 to 12 are cross-sectional views of the circuit of FIGS. 1 and 2 in the course of the various steps of its production.

In FIGS. 1 and 2 in which like references designate like elements, an n-type layer 2 is shown deposited on a substrate 1 of gallium arsenide Ga As. Integrated on this layer is a field effect transistor having a Schottky grid known under the name of MESFET.

This transistor comprises a source 3 and a drain 4 formed by ohmic contacts. These contacts may be formed from an alloy layer, for example a triple layer of nickel alloy/gold-germanium alloy/gold (thicknessess: 50/900/900 Angstroms respectively). These two perfectly localized contacts of dimensions of the order of 10 $\mu$m, are partially covered on their periphery by a layer 24, having a thickness of the order of 1000 Angstroms, of for example silica $SiO_2$ or silicon nitride $Si_3N_4$.

According to the invention, this layer covers the whole of the system as shown in FIG. 2, while having spot or localized apertures opening onto the layer 2. A Schottky contact 5 acting as a control grid is formed in one of these apertures located between the source and the drain. It has the illustrated shape and overlaps the layer 24 on its edges. This Schottky contact 5 forms, with deposits of the same type 6, 7, 8 and 9, the elements of a first interconnection layer. Its longitudinal dimension is on the order of 0.5 to 1 $\mu$m and its thickness is about 0.3 $\mu$m. This Schottky contact may be produced in the form of a multilayer deposit of Ti/Pt/Au/Ti having thicknessess of 500, 500, 1500, 50 Angstroms respectively. The layer of Ti of 50 Angstroms permits the adherence of the dielectric 13 intended to cover this layer. Note that the elements 8 and 9 are located outside the active layer and are deposited on the layer 24 in accordance with the invention. Another dielectric layer 13 which is much thicker than the layer 24 covers the assembly. It has apertures at the places of the source and drain contacts 6 and 7. FIG. 2 shows how the Schottky grid 5 remains in direct contact with the active zone 2 and then becomes a metalization layer 50 which passes at a point 12 above the layer 24 so as to be at the level of the lower connection layer.

The layer 13 of silica or silicon nitride, which is much thicker than the lower layer (ratio of the order of 5:1), has apertures in the region of source 3 and drain 4 and in the region of the connection element of the lower layer at 9. Placed in these apertures and above this layer is an upper interconnection layer 14. This upper layer must adhere to the dielectric. It is for example a multilayer deposit Ti/Pt/Au or Cr/Pt/Au. This upper layer is suitably insulated from the lower layer by the thick layer of dielectric 13. This thick layer of dielectric also has for advantage to suitably passify the Schottky grid. At 15, an aperture permits the connection between the two interconnection layers. To produce this assembly, several steps are required. Several thereof according to the invention, are achieved in accordance with the "lift-off" technique. This known process is recalled with the aid of FIGS. 3, 4 and 5.

FIG. 3 shows a substrate 100 which has been covered with a layer of resin 101. The latter has been isolated through a mask so that there remains after attack only in a zone 101 where it forms a stud.

The assembly was then covered with a dielectric layer 102 which completely covers the stud 101.

If the structure of FIG. 3 is attacked by a chemical agent capable of dissolving the stud 101, the latter disappears and carries the resin which caps it along therewith.

There then remains on the substrate a perfectly defined bared area as shown in FIG. 4.

In FIG. 5, it can be seen that this bared area is covered with a deposit of metal 103 whose zone of contact with the substrate 100 may be defined with high precision. This technique enables contacts having dimensions of the order of 0.5 $\mu$m to be formed with a precision which is much higher than with other methods.

The steps of the production process according to the invention are shown by the illustrations of FIGS. 6 to 12 in respect of a specimen in cross-section.

Figure 6:
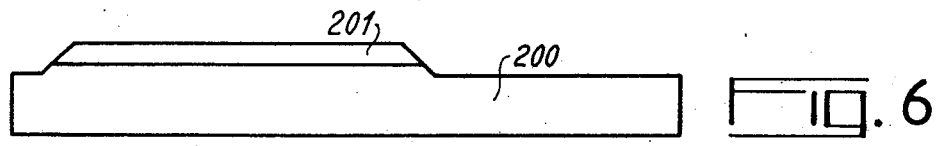

FIG. 6 shows that there has been deposited by epitaxy on a substrate 200 of semi-insulating gallium arsenide a layer of Ga As 201 of n-type whose thickness is less than 1 micron. This layer has been subjected to a "mesa" type attack and it is on this layer that an active element of the MESFET type will be formed, namely a field effect transistor having a Schottky grid. This element will be insulated from the other similar elements by the substrate itself. It will be understood that it is possible to form simultaneously a plurality of elements which are interconnected by interconnection layers the production steps of which will be described.

Figure 7:
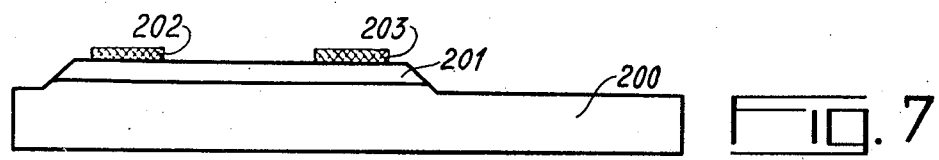

In FIG. 7, two ohmic contacts 202 and 203 have been deposited by "lift-off" masking and evaporation under a vacuum or any other process. The operation is carried out as indicated in FIGS. 3 to 5. These contacts are formed by three superimposed layers made from nickel, Au-Ge alloy and gold respectively as explained above.

Figure 8:
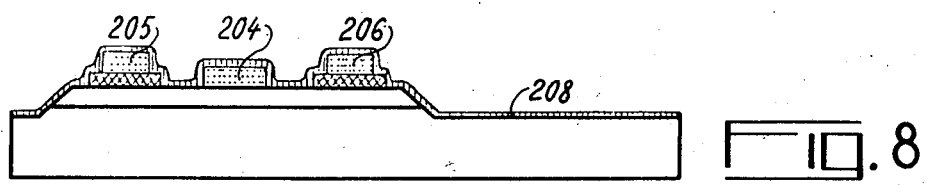

In FIG. 8, the three resin studs 204, 205 and 206 are shown to have been deposited respectively on the contacts 202 and 203 and also at the place where the Schottky grid of the transistor must be subsequently formed. Thereafter, the layer 208, for example of silica, is deposited on the assembly at a small thickness.

This dielectric layer 208 has a small thickness of 1000 to 1500 Angstroms. It may be deposited by cathodic sputtering at room temperature. Other process may be employed, but they must not alter the resin 204, 205 and 206.

Figure 9:
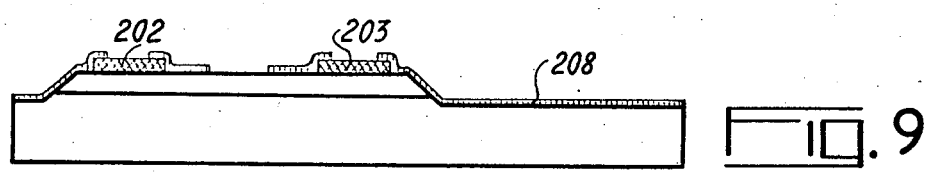

In FIG. 9, the resin has been removed by the "lift-off" process and bares the substrate in the place of the stud 204. The studs 205 and 206 leave in their place apertures which give access to the ohmic contacts 202 and 203. The layer 208 remains at the level of the substrate.

Figure 10:
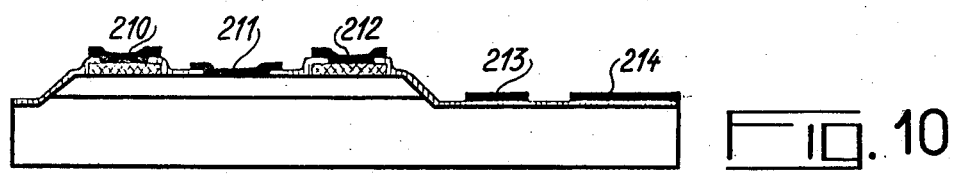

In FIG. 10, the lower interconnection layer has been deposited through another mask. It is formed by a quadriple deposit of titanium, platinum, gold, titanium, that is to say, Ti/Pt/Au/Ti. At 211, it forms the Schottky contact and at 210 and 212 it ensures the connections to the source and to the drain, the "lift-off" ensures a very high reproducibility of the various shapes owing to the perfectly defined geometry of the aperture. At 203 and 204, the lower layer ensures the connections between the various portions of circuits (not shown).

Note that the "lift-off" technique ensures high precision of the geometric definition of the Schottky contact. It can be seen that the connections 213 and 214 are insulated from the substrate. Consequently, there are no longer any interface phenomena between the conductive deposit of the sheet and the semi-insulating Ga As, which phenomena have been found by the Applicant to disturb the operation of such circuits. It must be stressed that, owing to this technique, any interaction between the electrodes is avoided.

Figure 11:
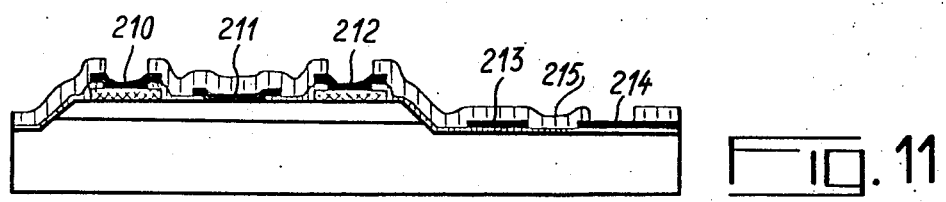

In FIG. 11, there has been formed, by the same technique of cathodic sputtering and "lift-off", on the assembly a second dielectric layer 215 of silica which is much thicker, namely, of the order of 10,000 Angstroms. This layer effectively protects the Schottky grid which it covers completely (see FIGS. 1 and 2).

Figure 12:
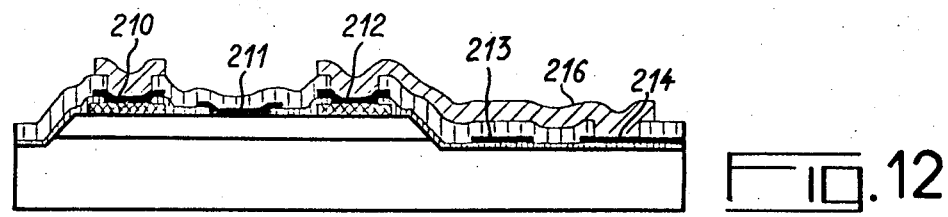

It is opened by the "lift-off" process (FIG. 12) so as to provide an access to the source and to the drain and to form another access with the conductor 214 of the lower connection layer. The upper connection layer 216 of titanium-platinum-gold is then deposited as shown in FIG. 12. It permits forming contacts with the source and the drain. It will be observed that the Schottky grid is already protected and that the ohmic contacts and their access resistors are easily reproducible. Lastly, at the crossing points without interconnection, the layers of conductors are separated by a thick layer of dielectric. It will be furthermore observed that no conductor outside the active zones is in direct contact with the substrate. Note also that the crossings with interconnections occur outside the active zone. Also note that the alloying operation which forms the ohmic contacts may be carried out at the stage of FIG. 7 or FIG. 9, indifferently. It may be more advantageous for the geometric definition of these ohmic contacts to carry out this this operation at the stage of FIG. 9.

Another advantage of the invention consists of the fact that Schottky gates, for example in the case of high frequency field effect transistor, can be very narrow as it is wished at very high frequency, whereas the Schottky contact has a greater surface (favourable to the quality) owing to the fact that the metal can overlape the thin dielectric layer on every side of the opening wherein the contact is located.

What we claim is:

1. A process for producing an integrated circuit on a semi-insulating substrate formed by a monocrystalline compound of the groups III and V of the Mendeleev classification, comprising the preliminary steps of forming an n-type layer of the same compound, and treating said layer so as to localize at least one active zone said process comprising the following steps:

(A) depositing an ohmic contact in the active zone;
   (B) depositing a first thin dielectric layer and opening windows in said first layer by a "lift-off" process so that the active zone is bared at the locations of zones where Schottky contacts are to be formed and so that said ohmic contact is bared;
   (C) depositing in said windows and on the rest of the first dielectric layer a first metalization layer of connections providing a Schottky contact with the bared portion of said active layer and a connection with said ohmic contact;
   (D) depositing on the assembly a second dielectric layer which is thicker than said first layer and opening by a "lift-off" process of windows in said second layer at places baring the first metalization layer;
   (E) depositing a second metalization layer of connections on said second dielectric layer and in its windows allowing connection through said second metalization layer to said Schottky contact at a point isolated from said active zone by said dielectric layers.

2. A process as claimed in claim 1, wherein the compound is gallium arsenide.

3. A process as claimed in claim 2, wherein the dielectric is silica or silicon nitride.

* * * * *